(12) United States Patent
Yamagata (10) Patent No.: US 7,902,672 B2
(45) Date of Patent: Mar. 8, 2011

(54) SEMICONDUCTOR DEVICE AND METHOD OF MANUFACTURING SAME (75) Inventor: Osamu Yamagata, Kanagawa (JP)

(73) Assignee: Sony Corporation, Tokyo (JP)

( * ) Notice: Subject to any disclaimer, the term of this patent is extended or adjusted under 35 U.S.C. 154(b) by 44 days.

(21) Appl. No.: 11/890,810

(22) Filed: Aug. 8, 2007

(65) Prior Publication Data
US 2008/0284040 A1 Nov. 20, 2008

(30) Foreign Application Priority Data

Aug. 17, 2006 (JP) .............................. P2006-222468

(51) Int. Cl.
*H01L 23/48* (2006.01)
(52) U.S. Cl. ............................... 257/774; 257/E23.145
(58) Field of Classification Search .......... 257/774–780, 257/758, E23.145
See application file for complete search history.

(56) References Cited

U.S. PATENT DOCUMENTS

| | | | | |
|---|---|---|---|---|
| 6,515,372 B1* | 2/2003 | Narizuka et al. | ............ | 257/779 |
| 6,841,875 B2* | 1/2005 | Ohsumi | ........................ | 257/738 |
| 7,365,434 B2* | 4/2008 | Aiba | ............................. | 257/773 |
| 2003/0011073 A1* | 1/2003 | Shinogi et al. | ................ | 257/758 |
| 2006/0022350 A1* | 2/2006 | Watkins | ........................ | 257/779 |
| 2006/0065978 A1* | 3/2006 | Nishiyama et al. | ........... | 257/737 |

FOREIGN PATENT DOCUMENTS

| | | |
|---|---|---|
| JP | 2002-313696 | 10/2002 |
| JP | 2003-124236 | 4/2003 |
| JP | 2005-277034 | 10/2005 |
| JP | 2006-156937 | 6/2006 |

* cited by examiner

Primary Examiner — Nathan W Ha
(74) Attorney, Agent, or Firm — Robert J. Depke; Rockey, Depke & Lyons, LLC

(57) ABSTRACT

A semiconductor device in a packaged form including a semiconductor includes a semiconductor substrate with an active component disposed thereon and pads disposed on a surface thereof and connected to the active component, a first interconnection disposed on the semiconductor substrate and connected to the pads, a first insulating layer disposed on the semiconductor substrate in covering relation to the first interconnection and having an opening reaching a portion of the first interconnection, and a second interconnection disposed in the opening and on the first insulating layer and connected to the first interconnection.

4 Claims, 10 Drawing Sheets

SEMICONDUCTOR DEVICE AND METHOD OF MANUFACTURING SAME

CROSS REFERENCES TO RELATED APPLICATIONS

The present invention contains subject matter related to Japanese Patent Application JP 2006-222468 filed in the Japan Patent Office on Aug. 17, 2006, the entire contents of which being incorporated herein by reference.

BACKGROUND OF THE INVENTION

1. Field of the Invention

The present invention relates to a semiconductor device and a method of manufacturing such a semiconductor device, and more particularly to a semiconductor device in a packaged form with a rerouting layer on a semiconductor substrate and a method of manufacturing such a semiconductor device.

2. Description of the Related Art

There have been growing demands for smaller, thinner, and lighter portable electronic devices including digital video cameras, digital mobile phones, and laptop personal computers. To meet the demands, recent semiconductor devices such as VLSI circuits have been scaled down 70 percent in three years. In addition, research and development efforts have been made to perform the important task of increasing the packing density of parts on a mounting board (printed wiring board) in electronic circuit devices wherein semiconductor devices are mounted on printed wiring boards.

Semiconductor device package forms have progressed from the lead-insertion type such as DIP (Dual Inline Package) to the surface-mounted type. There has further been developed a flip-chip mounting process wherein bumps (protrusive electrodes) of solder or gold are disposed on pad electrodes of a semiconductor chip and the semiconductor chip is connected with its face down to a wiring board by the bumps.

Efforts have also been made to develop semiconductor device packages in a complex form called SiP (System in Package) which incorporate passive components such as inductors and capacitors and include matching circuits and filters.

Japanese Patent Laid-Open No. 2003-124236, for example, discloses the structure of a semiconductor device in the SiP form.

If a SiP is packaged in a wafer level, then it is designed to provide a structure in which new interconnects on active components (hereinafter referred to as rerouting) to provide connection to the electrodes of the active components.

If rerouting interconnects are provided as a single layer, then external terminals may not be disposed on the electrodes of the active components. For forming rerouting interconnections to provide a necessary number of I/O ports, then the L/S has to be reduced if a single layer of rerouting interconnects is employed, and hence device design, processes, and materials need to be changed.

Even if the number of I/O ports is sufficient, the number of I/O ports has to be reduced or the I/O ports have to be arrayed in two rows in a peripheral area in order to avoid interference with the electrodes of the active components. As a result, the mounting board has to carry components in a high packing density.

The above problems can be solved by employing two layers of rerouting interconnections. However, the two layers of rerouting interconnections demands insulating layers to be doubled for embedding the interconnections therein, resulting in an increased cost.

Insulating layers to be formed are necessary to be thick enough to fill up steps. The thick insulating layers, however, tends to increase any warpage of the wafer. The increased wafer warpage causes device handling problems in an external electrode forming process, a measuring process, and a thinning process, and the device handling problems are liable to lower the production efficiency.

SUMMARY OF THE INVENTION

In semiconductor device packages wherein rerouting interconnections are formed on a semiconductor substrate, it is difficult to thin insulating layers with the rerouting interconnections embedded therein.

According to an embodiment of the present invention, a semiconductor device in a packaged form including a semiconductor, includes a semiconductor substrate with an active component disposed thereon and pads disposed on a surface thereof and connected to the active component, a first interconnection disposed on the semiconductor substrate and connected to the pads, a first insulating layer disposed on the semiconductor substrate in covering relation to the first interconnection and having an opening reaching a portion of the first interconnection, and a second interconnection disposed in the opening and on the first insulating layer and connected to the first interconnection.

With the above semiconductor device, the first interconnection connected to the pads is disposed on the semiconductor substrate with the active component disposed thereon and the pads disposed on the surface thereof and connected to the active component. The first insulating layer is disposed on the semiconductor substrate in covering relation to the first interconnection and has the opening reaching the portion of the first interconnection. The second interconnection is disposed in the opening and on the first insulating layer and connected to the first interconnection.

According to an embodiment of the present invention, a method of manufacturing a semiconductor device in a packaged form including a semiconductor, includes the steps of forming a first interconnection on a semiconductor substrate with an active component disposed thereon and pads disposed on a surface thereof and connected to the active component, the first interconnection being connected to the pads, forming a first insulating layer on the semiconductor substrate in covering relation to the first interconnection, the first insulating layer having an opening reaching a portion of the first interconnection, and forming a second interconnection in the opening and on the first insulating layer, the second interconnection being connected to the first interconnection.

With the above method of manufacturing the semiconductor device, the first interconnection connected to the pads is formed on the semiconductor substrate with the active component disposed thereon and the pads disposed on the surface thereof and connected to the active component.

Then, the first insulating layer is formed on the semiconductor substrate in covering relation to the first interconnection, the first insulating layer having the opening reaching the portion of the first interconnection.

Then, the second interconnection is formed in the opening and on the first insulating layer, the second interconnection being connected to the first interconnection.

According to an embodiment of the present invention, in a packaged semiconductor device with rerouting interconnections disposed on a semiconductor substrate, an insulating layer in which the rerouting interconnections embedded therein is made thin.

According to an embodiment of the present invention, when a packaged semiconductor device with rerouting interconnections disposed on a semiconductor substrate is manufactured by the above method, an insulating layer in which the rerouting interconnections embedded therein is made thin.

DETAILED DESCRIPTION OF THE PREFERRED EMBODIMENTS

Semiconductor devices and methods of manufacturing such semiconductor devices according to embodiments of the present invention will be described in detail below with reference to the drawings.

First Embodiment

Figure 1A:
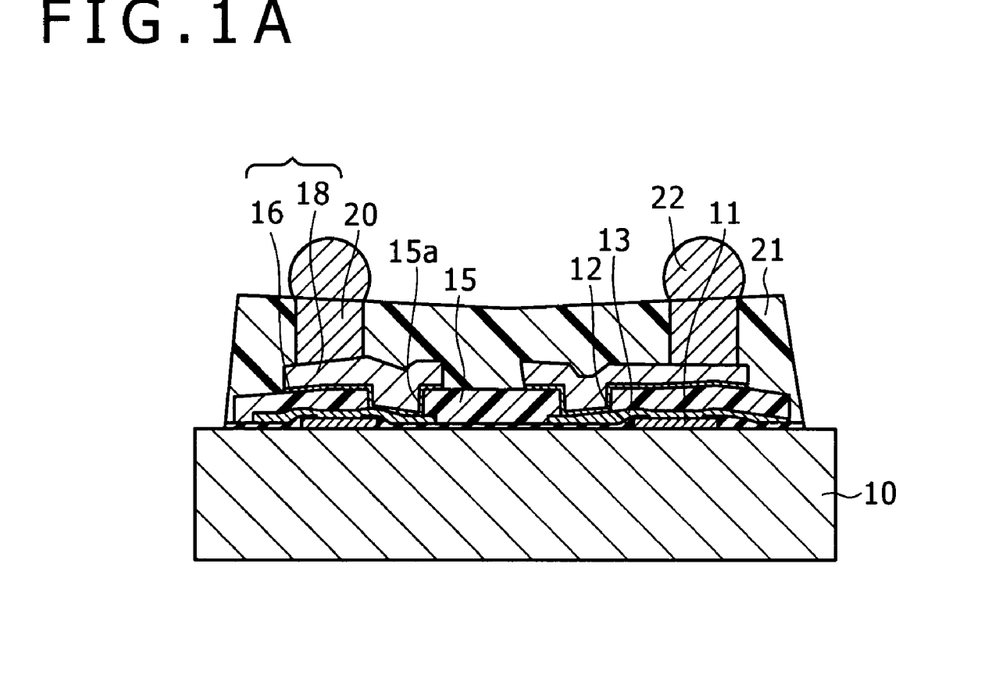
FIG. 1A is a cross-sectional view of a semiconductor device according to a first embodiment of the present invention.

FIG. 1A shows in cross section a semiconductor device according to a first embodiment of the present invention, the semiconductor device being packaged with rerouting interconnections formed on a semiconductor substrate.

As shown in FIG. 1A, pads 11 are disposed on a silicon substrate 10 on which an electronic circuit including active components is disposed, the pads 11 being connected to the electronic circuit. The area of the silicon substrate 10 which is free of the pads 11 is covered with a protective layer 12 such as of silicon oxide or the like.

The silicon substrate 10 is of a size that is equal to or greater than 4.5 mm$^2$.

First interconnections 13 of TiCu or the like are connected to the pads 11. Each of the first interconnections 13 includes a Ti layer having a thickness of 160 nm and a Cu layer having a thickness of 800 nm, for example. The total thickness of each of the first interconnections 13 is equal to or smaller than 1 µm.

Figure 1B:
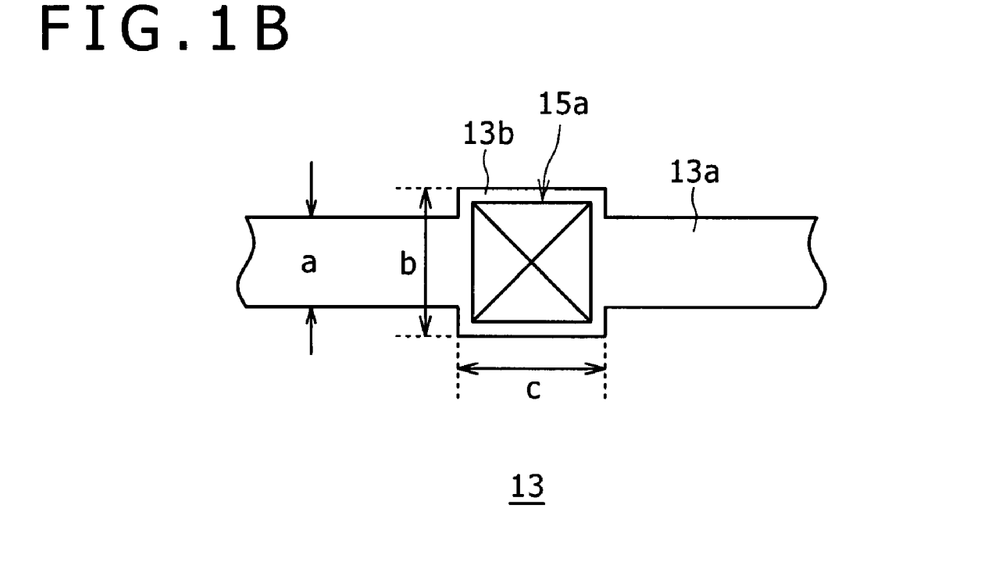
FIG. 1B is an enlarged fragmentary plan view of a first interconnection of the semiconductor device according to the first embodiment.

FIG. 1B shows in plan each of the first interconnections 13. As shown in FIG. 1B, the first interconnection 13 includes an interconnection region 13a and a land region 13b. The interconnection region 13a has a width a of about 30 µm. The land region 13b has a width b and a length c and has a size b×c=about 100 µm×100 µm, and hence is wider than the interconnection region 13a.

A first insulating layer 15 of polyimide resin or the like is disposed on the protective layer 12 in covering relation to the first interconnections 13.

The first insulating layer 15 has openings 15a defined therein which reach the land regions 13b of the first interconnections 13. Each of the openings 15a has a diameter of about 100 µm. FIG. 1B shows the layout of the opening 15a with respect to the land region 13b.

Second interconnections are disposed on the first insulating layer 15 and are partly embedded in the openings 15a and integral with plugs connected to the first interconnections 13. Each of the second interconnections includes a seed layer 16 of TiCu and a copper layer 18.

The openings 15a are of a large size because the small thickness (1 µm) of the first interconnections 13 and the thickness of the upper interconnections formed by copper plating need to be kept in balance for relaxing stresses. The lands 13b of the first interconnections 13 are set to the above size to make the openings 15a large.

Electrically conductive posts 20 of copper or the like are connected to the second interconnections.

An insulative buffer layer 21 that is made of polyamideimide resin, polyimide resin, epoxy resin, phenolic resin, or polyparaphenylene benzobisoxazole, is disposed on the first insulating layer 15 between the electrically conductive posts 20.

Bumps (protrusive electrodes) 22 are disposed on the buffer layer 21 and connected to the electrically conductive posts 20, respectively.

In the semiconductor device according to the first embodiment, interconnection layers including the first interconnections 13 and the second interconnections (the layers 16, 18) are embedded in the insulating layers including the first insulating layer 15 and the buffer layer 21.

Though the first interconnections 13 and the second interconnections (the layers 16, 18) are stacked on the silicon substrate 10, the first interconnections 13 are in the form of thin-film interconnections having a very small thickness equal to or less than 1 µm, the first interconnections 13 are directly formed on the silicon substrate 10 with no resin insulating layer required beneath the first interconnections 13.

Consequently, in a packaged semiconductor device with rerouting interconnections disposed on a semiconductor substrate, an insulating layer in which the rerouting interconnections embedded therein is made thin.

A method of manufacturing the semiconductor device according to the first embodiment will be described below with reference to FIGS. 2A through 2S. According to the present embodiment, all the steps of the manufacturing method can be carried out in a wafer level.

Figure 2A:
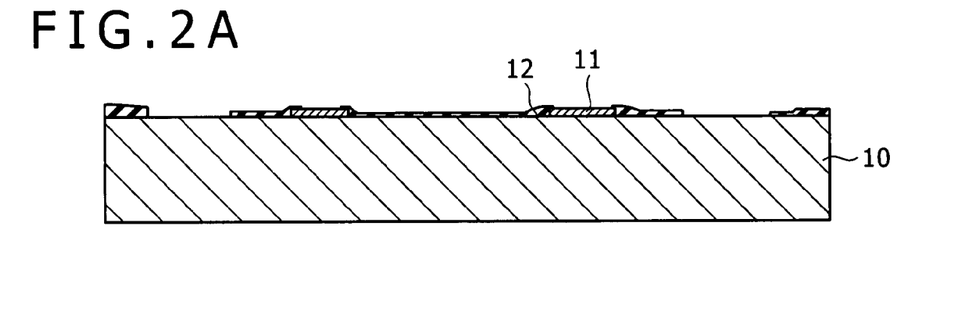
FIGS. 2A through 2S are cross-sectional views illustrative of steps of a method of manufacturing the semiconductor device according to the first embodiment.

As shown in FIG. 2A, an electronic circuit including active components, not shown, is formed on a silicon substrate 10 having a thickness of 725 µm, and pads 11 are formed on the silicon substrate 10 which are connected to the electronic circuit in the circuit plane. The area of the silicon substrate 10 which is free of the pads 11 is covered with a protective layer 12 of silicon oxide or the like.

Figure 2B:
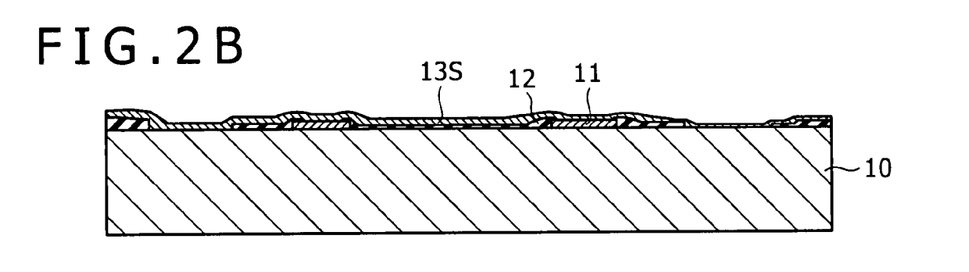

Then, as shown in FIG. 2B, a TiCu layer 13S is deposited on the entire surface formed so far over the protective layer 12 and the pads 11 by sputtering, for example. The TiCu layer 13S includes a Ti film having a thickness of 160 nm and a Cu film having a thickness of 600 nm, for example.

Figure 2C:
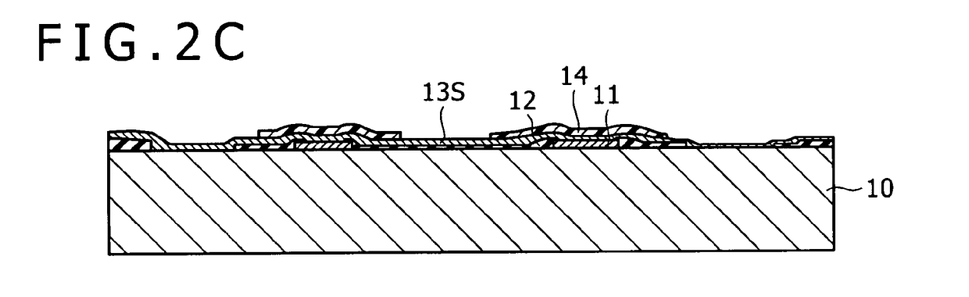

Then, as shown in FIG. 2C, a resist film 14 having the pattern of first interconnections is deposited on the TiCu film 13S by photolithography, for example.

Figure 2D:
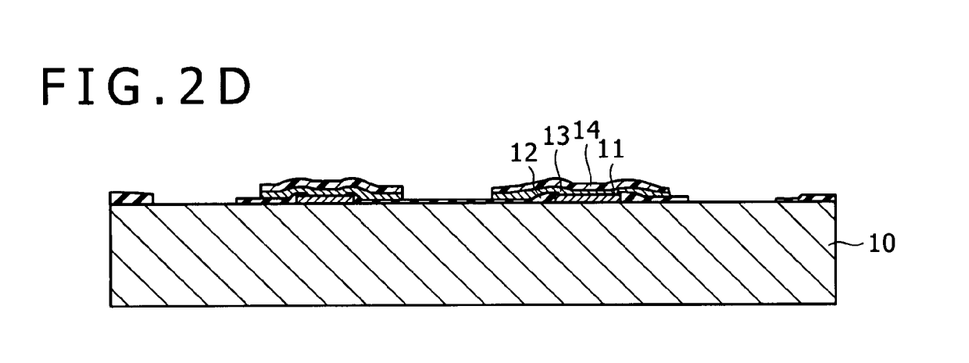

Then, as shown in FIG. 2D, the TiCu layer 13S is etched by RIE, using the resist film 14 as a mask, thereby forming first interconnections 13 of TiCu.

Figure 2E:
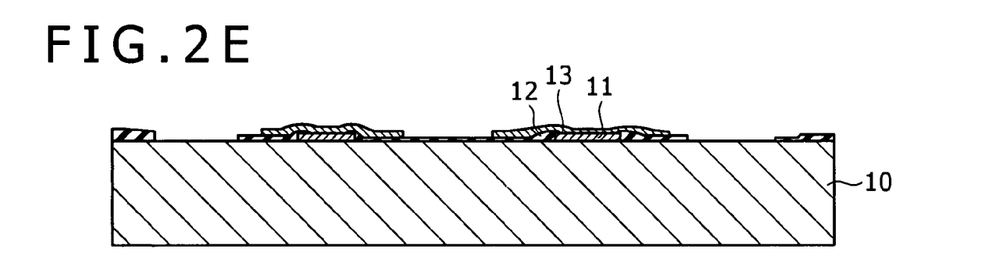
Figure 2F:
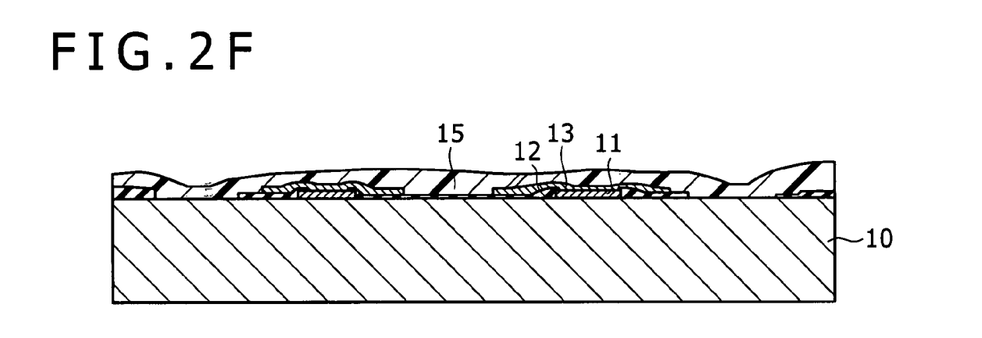

Then, as shown in FIG. 2E, the resist film 14 is removed by ashing, for example. Thereafter, as shown in FIG. 2F, the entire surface formed so far is supplied with a photosensitive insulating material such as polyimide resin, phenolic resin, epoxy resin, or the like by spin coating or printing, thereby forming a first insulating layer 15. The first insulating layer 15 has a thickness ranging from about 4 to 10 μm after it is cured.

If the first insulating layer 15 is formed of photosensitive polyimide resin by spin coating, then it is grown under the following conditions:

Spin coating: 1000 rpm (30 seconds)+1950 rpm (40 seconds)+1000 rpm (10 seconds)+1500 rpm (10 seconds) +1500 rpm (10 seconds);

Prebaking: 90° C. (120 seconds)+100° C. (120 seconds).

Figure 2G:
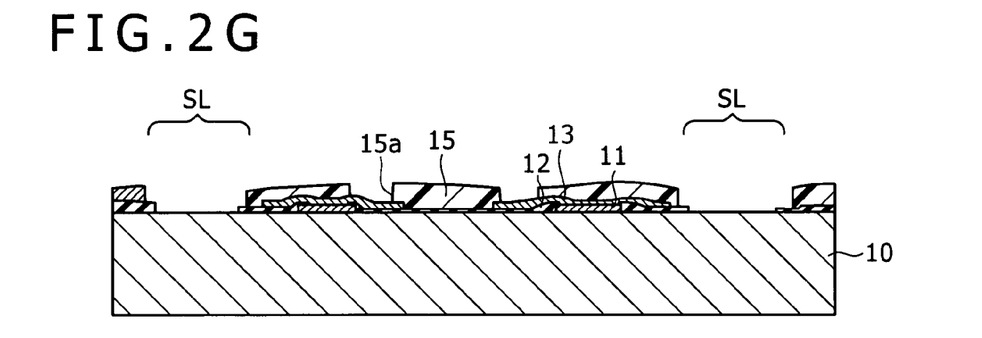

Then, as shown in FIG. 2G, openings 15a which reach the lands 13b of the first interconnections 13 are formed in the first insulating layer 15 by exposing the first insulating layer 15 to an exposure level of 125 mJ/cm$^2$, for example, according to a pattern and then developing it. At this time, regions of the first insulating layer 15 along scribing lines SL are also removed.

After the development, the first insulating layer 15 is cured by a post-curing process at 300° C. for 60 minutes.

Figure 2H:
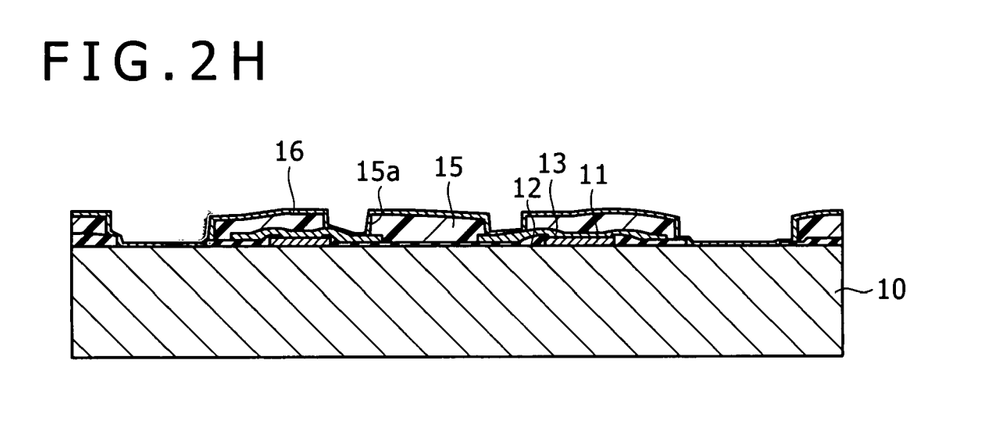

Then, as shown FIG. 2H, after the entire surface is descummed and etched for sputtering pretreatment, a TiCu layer is deposited on the entire surface, covering the openings 15a in the first insulating layer 15, by sputtering, thereby forming a seed layer 16. The TiCu layer includes a Ti film having a thickness of 160 nm and a Cu film having a thickness of 600 nm, for example.

Figure 2I:
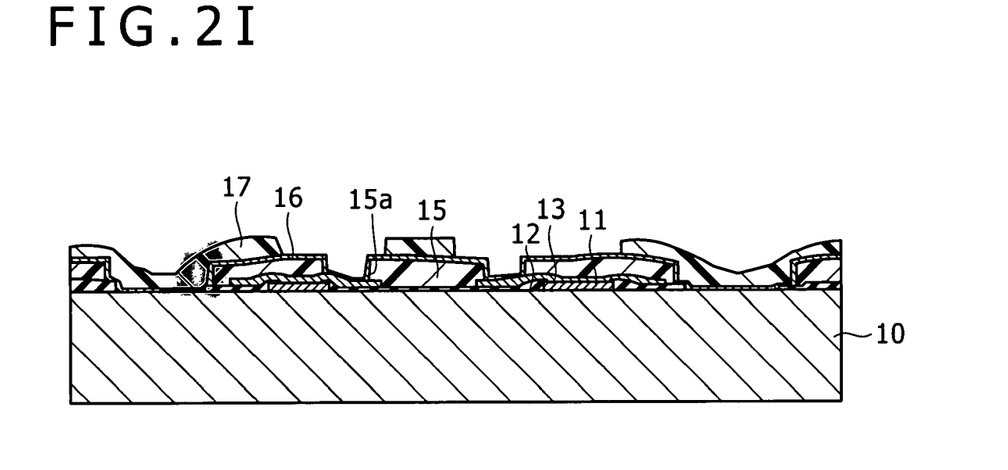

Then, as shown in FIG. 2I, a resist film is applied and developed to prevent other regions than the openings 15a in the first insulating layer 15 and second interconnection forming regions from being plated. Specifically, a resist film 17 is deposited in a pattern exposing the openings 15a in the first insulating layer 15 and the second interconnection forming regions.

Figure 2J:
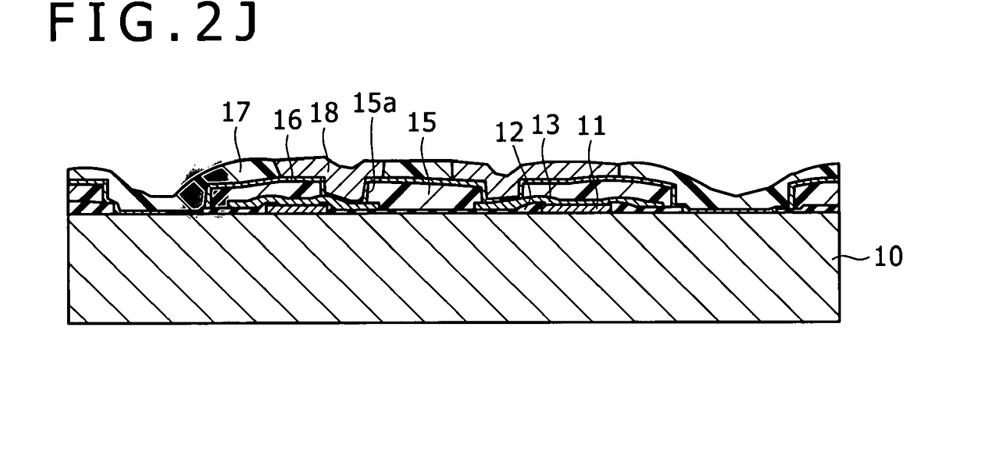

Then, as shown in FIG. 2J, copper layers 18 are formed in the openings 15a in the first insulating layer 15 and the second interconnection forming regions by plating them with copper according to an electrolytic plating process which uses the resist film 17 as a mask and uses the seed layer 16 as one of the electrodes.

Figure 2K:
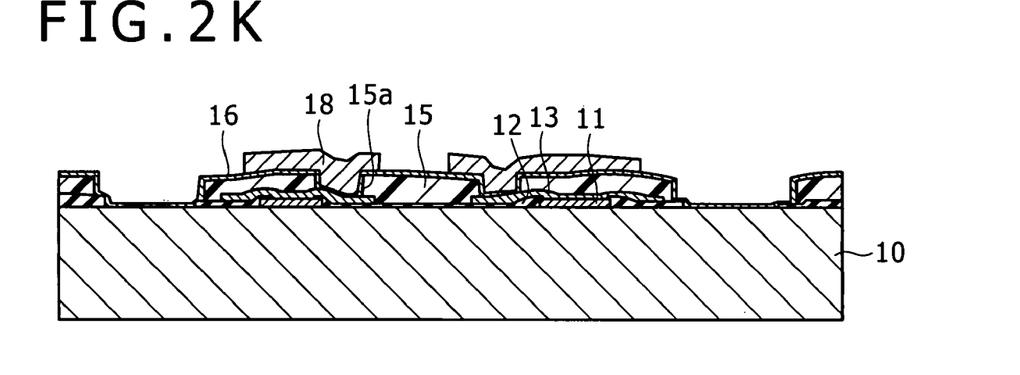
Figure 2L:
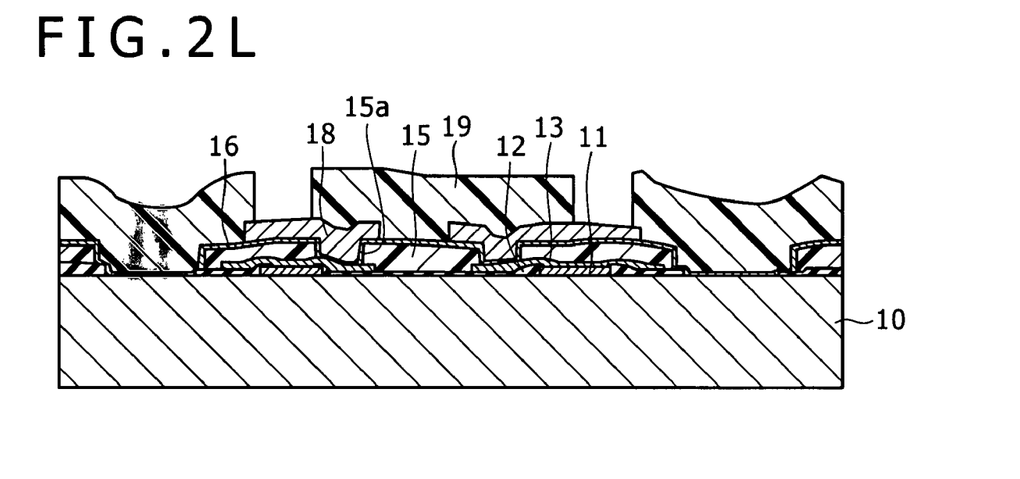

Then, as shown in FIG. 2K, the resist film 17 is removed by ashing, for example. Thereafter, as shown in FIG. 2L, a resist film 19 is formed by spin coating, for example, and exposed and developed by photolithography to form openings reaching the surfaces of the copper layers 18 in electrically conductive post forming regions.

Figure 2M:
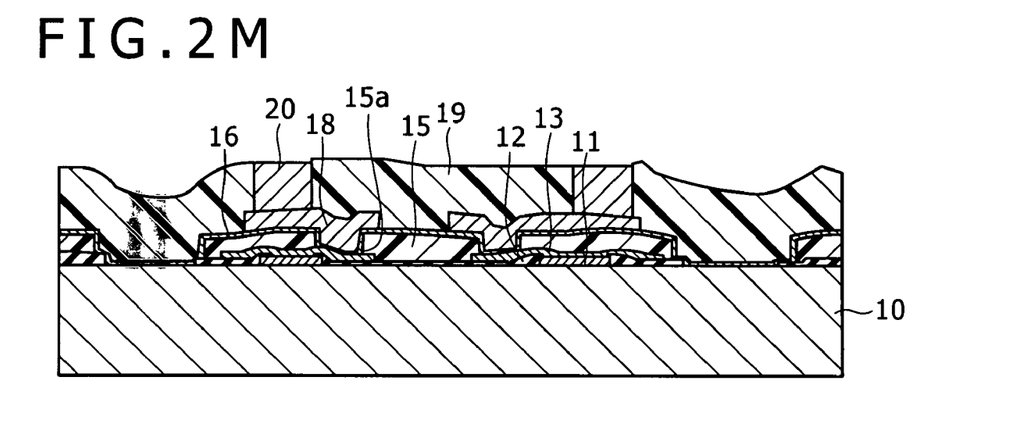

Then, as shown in FIG. 2M, electrically conductive posts 20 are formed on the copper layers 18 in the openings in the resist film 19 according to an electrolytic plating process which uses the seed layer 16 as one of the electrodes. Each of the electrically conductive posts 20 has a diameter ranging from 180 to 300 μm and a height in the range from 80 to 180 μm.

Figure 2N:
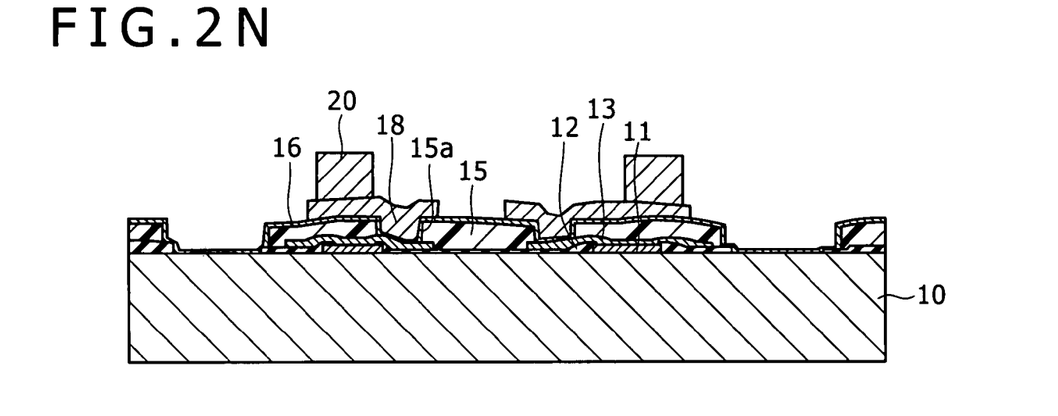
Figure 2O:
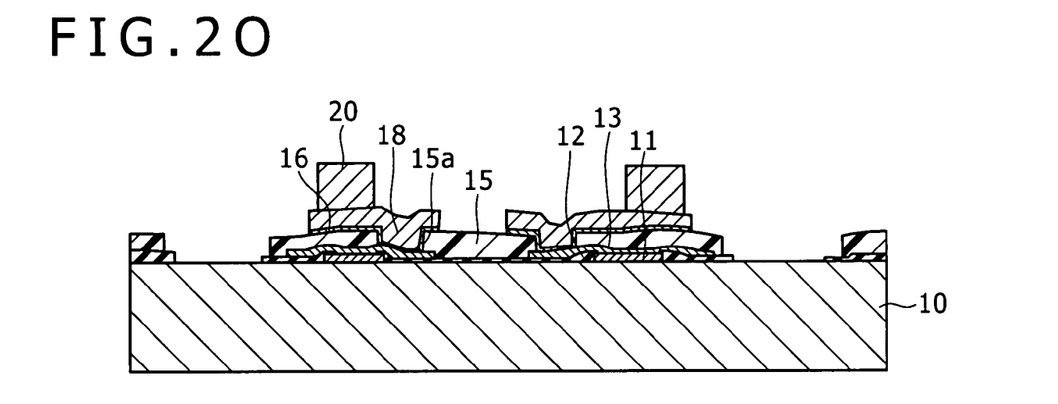

Then, as shown in FIG. 2N, the resist film 19 is removed by ashing, for example. Thereafter, as shown in FIG. 2P, the seed layer 16 is etched using the electrically conductive posts 20 and the copper layers 18 as a mask, for example.

In this manner, second interconnections made up of the seed layer 16 and the copper layers 18 are formed on the first insulating layer 15 integrally with the plugs connected to the first interconnections 13 and the electrically conductive posts 20 are formed thereon.

Figure 2P:
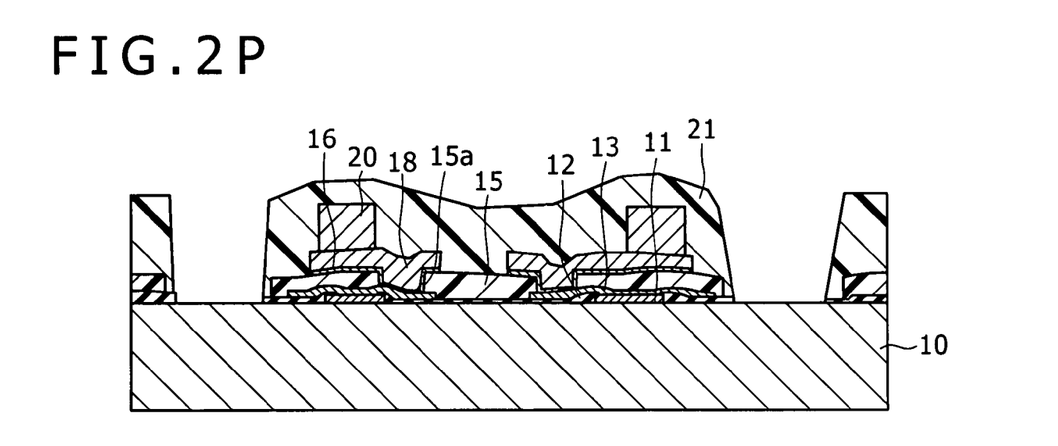

Then, as shown in FIG. 2P, an insulative buffer layer 21 is deposited to a thickness large enough to fully cover the electrically conductive posts 20 by depositing epoxy-based resin, polyimide-based resin, silicone-based resin, polyamideimide resin, polyimide resin, phenolic resin, or polyparaphenylene benzobisoxazole resin or the like by spin coating, printing, or molding.

Figure 2Q:
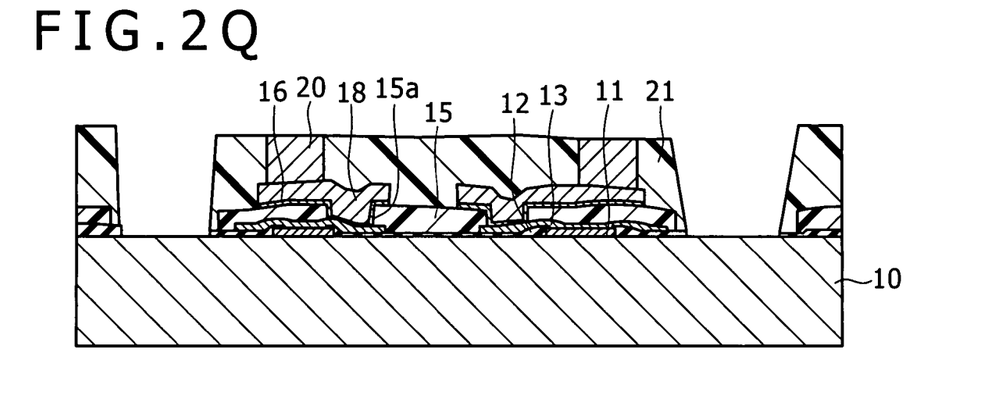

Then, as shown in FIG. 2Q, after the resin of the buffer layer 21 is cured, the upper ends of the electrically conductive posts 20 are exposed by grinding, for example. At this time, a grinding wheel of #600, for example, is used and rotated at 3500 rpm to grind the buffer layer 21 at a rate of 0.5 mm/sec.

Figure 2R:
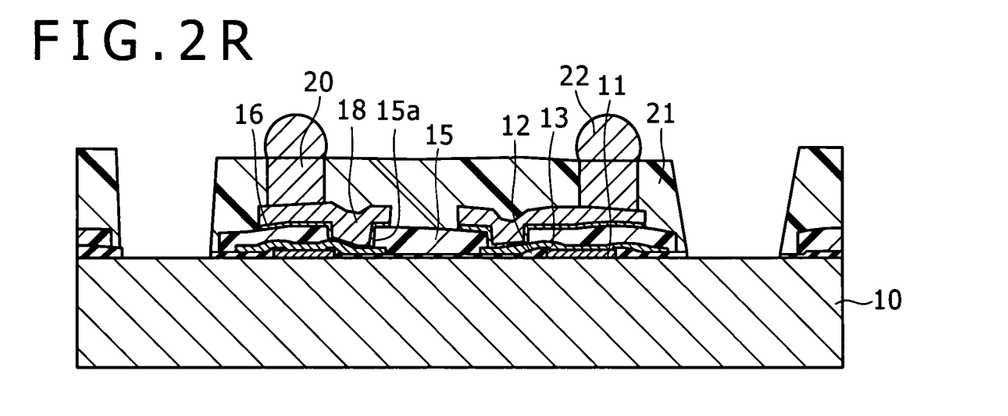

Then, as shown in FIG. 2R, bumps (protrusive electrodes) 22 are formed so as to be connected to the respective electrically conductive posts 20 by placing solder balls or printing solder paste.

Figure 2S:
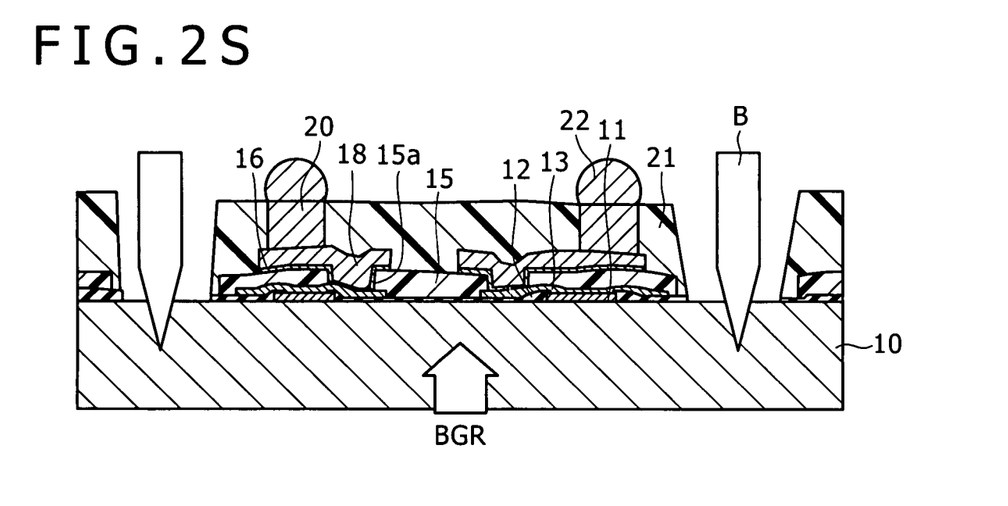

Thereafter, as shown in FIG. 2S, the silicon substrate 10 is thinned to a desired thickness from its reverse side by BGR, for example, and is diced into individual semiconductor devices by blades B.

The semiconductor device shown in FIG. 1A is now completed.

The method of manufacturing the semiconductor device according to the first embodiment offers the following advantages: When the first interconnections 13 and the second interconnections (16, 18) are formed on the silicone substrate 10, the first interconnections 13 are directly formed as a very thin film having a thickness equal to or less than 1 μm, with no resin insulating layer required beneath the first interconnections 13.

Therefore, when a packaged semiconductor device with rerouting interconnections disposed on a semiconductor substrate is manufactured by the above method, an insulating layer in which the rerouting interconnections embedded therein is made thin.

Furthermore, in a wafer-level package having rerouting interconnections provided in two or more layers, any wafer warpage caused by multilayer interconnections is reduced, allowing interconnections to be laid out in two or more layers with increased freedom. Therefore, the positions of external electrodes do not depend on the positions of the electrodes of the active components, and hence can easily be located in a peripheral area. However, the first interconnections should preferably be laid out over as small distances as possible, rather than large distances, because of high-frequency characteristics thereof.

The number of the steps of the method of manufacturing the semiconductor device according to the present embodiment is smaller than if the steps of plating Cu and forming an insulating layer are repeated.

Second Embodiment

Figure 3:
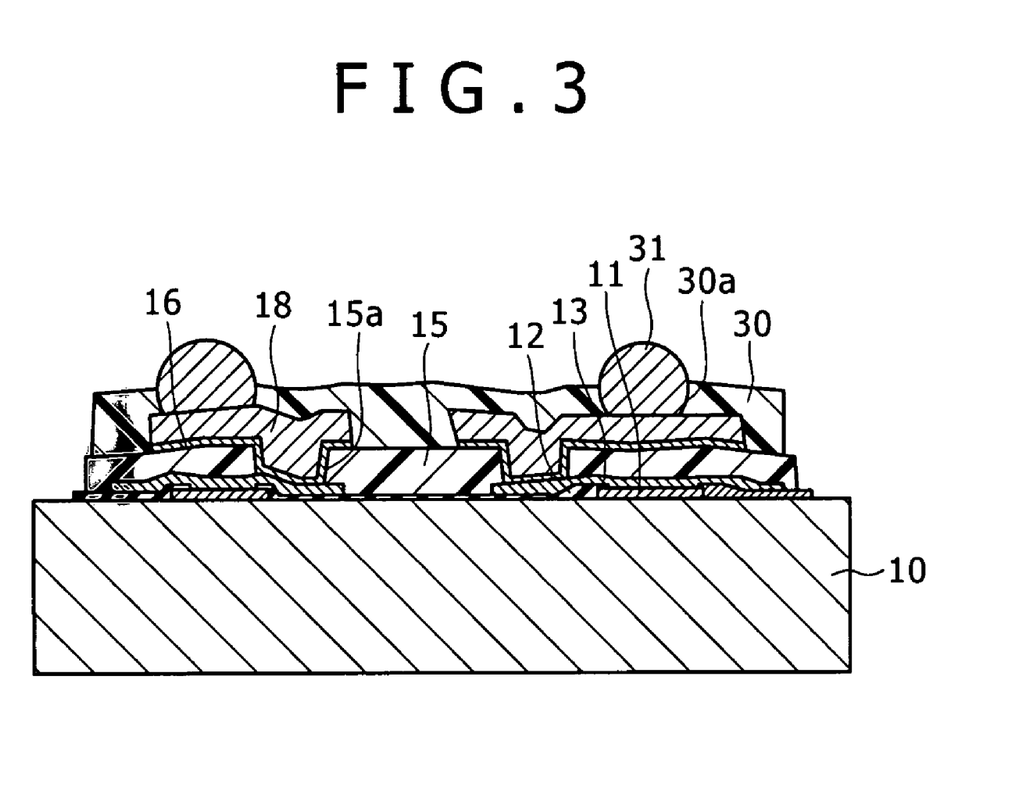
FIG. 3 is a cross-sectional view of a semiconductor device according to a second embodiment of the present invention.

FIG. 3 shows in cross section a semiconductor device according to a second embodiment of the present invention, the semiconductor device being packaged with rerouting interconnections formed on a semiconductor substrate.

The semiconductor device according to the second embodiment differs from the semiconductor device according to the first embodiment in that it is free of buffer layers 21 and electrically conductive posts 20, a second insulating layer 30 of polyimide is disposed on the first insulating layer 15 in covering relation to the second interconnections (16, 18), the second insulating layer 30 has openings 30a reaching the copper layers 18 of the second interconnections, and pumps 31 are disposed in the openings 30a and connected to the second interconnections. Other details of the semiconductor device according to the second embodiment are the same as those of the semiconductor device according to the first embodiment.

The silicon substrate 10 is of a size that is equal to or smaller than 4.5 mm². Therefore, the semiconductor device does not require buffer layers and electrically conductive posts for stress relaxation.

In the semiconductor device according to the second embodiment, the first interconnections 13 and the second interconnections (16, 18) are formed on the silicone substrate 10, and the first interconnections 13 are directly formed as a very thin film having a thickness less than 1 μm, with no resin insulating layer required beneath the first interconnections 13.

Consequently, in a packaged semiconductor device with rerouting interconnections disposed on a semiconductor substrate, an insulating layer in which the rerouting interconnections embedded therein is made thin.

Since the semiconductor device according to the second embodiment is free of the electrically conductive posts that are employed in the semiconductor device according to the first embodiment, no time-consuming plating process is required, and the thickness of the semiconductor device is reduced.

A method of manufacturing the semiconductor device according to the second embodiment will be described below with reference to FIGS. 4A through 4F. According to the present embodiment, all the steps of the manufacturing method can be carried out in a wafer level, as with the first embodiment.

Figure 4A:
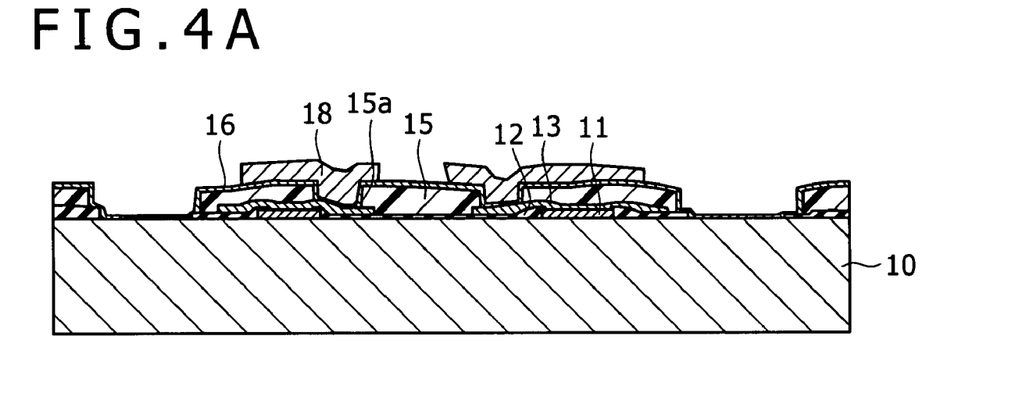
FIGS. 4A through 4F are cross-sectional views illustrative of steps of a method of manufacturing the semiconductor device according to the second embodiment.

The method up to the step shown in FIG. 4A is carried out in the same manner as with the first embodiment.

For example, pads 11 connected to the electronic circuit and a protective layer 12 are formed on the silicon substrate 10, and first interconnections 13 connected to the pads 11 are formed. A first insulating layer 15 is formed, and openings 15a reaching the first interconnections 13 are formed in the first insulating layer 15. A seed layer 16 is formed on the entire surface in covering relation to the openings 15a, and copper layers 18 are formed in the openings 15a and the first interconnection forming regions.

Figure 4B:
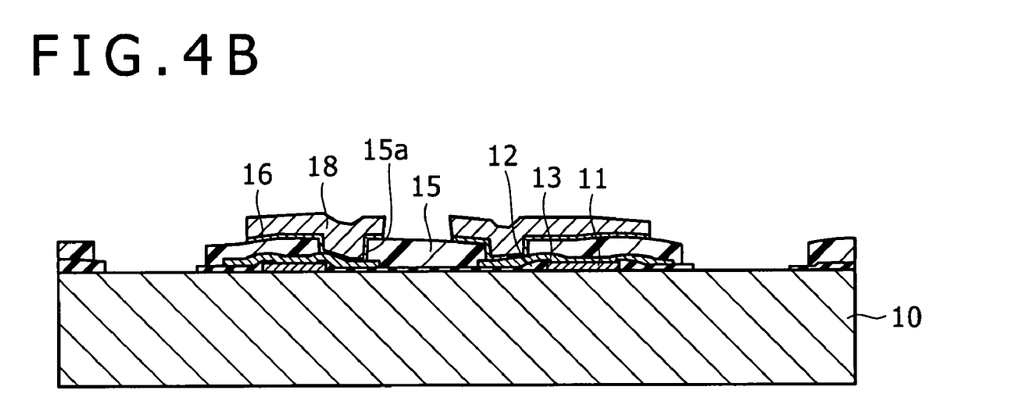

Then, as shown in FIG. 4B, the seed layer 16 is etched using the copper layers 18 as a mask.

Second interconnections made up of the seed layer 16 and the copper layers 18 are now formed on the first insulating layer 15 integrally with the plugs connected to the first interconnections 13.

Figure 4C:
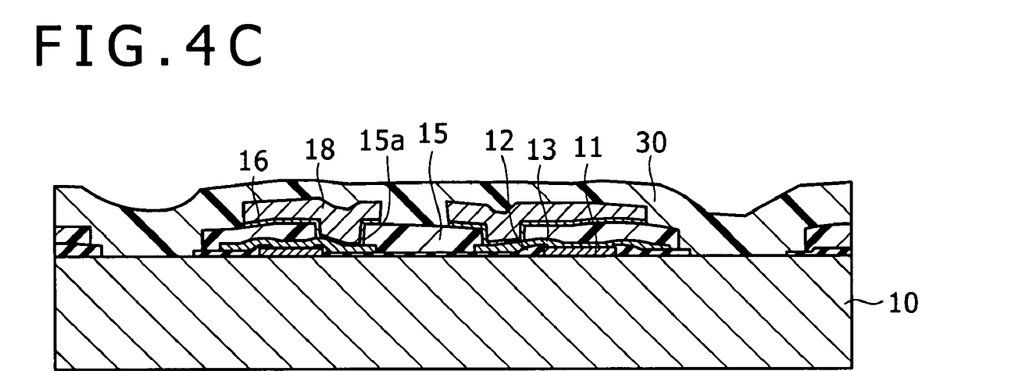

Then, as shown in FIG. 4C, the entire surface formed so far is supplied with a photosensitive insulating material such as polyimide resin, phenolic resin, epoxy resin, or the like by spin coating or printing, thereby forming a second insulating layer 30. The second insulating layer 30 has a thickness ranging from about 4 to 10 μm after it is cured.

If the second insulating layer 30 is formed of photosensitive polyimide resin by spin coating, then it is grown under the following conditions:

Spin coating: 1000 rpm (30 seconds)+1950 rpm (40 seconds)+1000 rpm (10 seconds)+1500 rpm (10 seconds);

Prebaking: 90° C. (120 seconds)+100° C. (120 seconds)

Figure 4D:
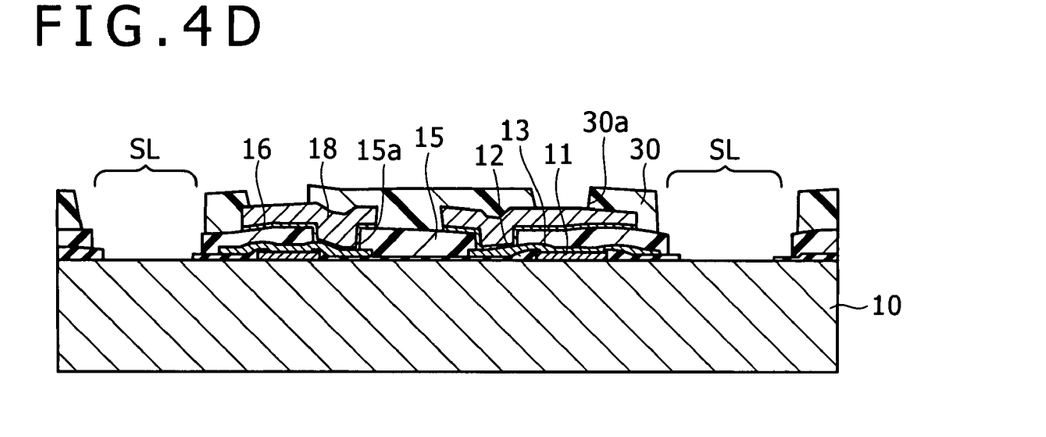

Then, as shown in FIG. 4D, openings 30a which reach the copper layers 18 of the second interconnections are formed by exposing the second insulating layer 30 to an exposure level of 125 mJ/cm₂, for example, according to a pattern and then developing it. At this time, regions of the second insulating layer 30 along scribing lines SL are also removed.

After the development, the second insulating layer 30 is cured by a post-curing process at 300° C. for 60 minutes.

Figure 4E:
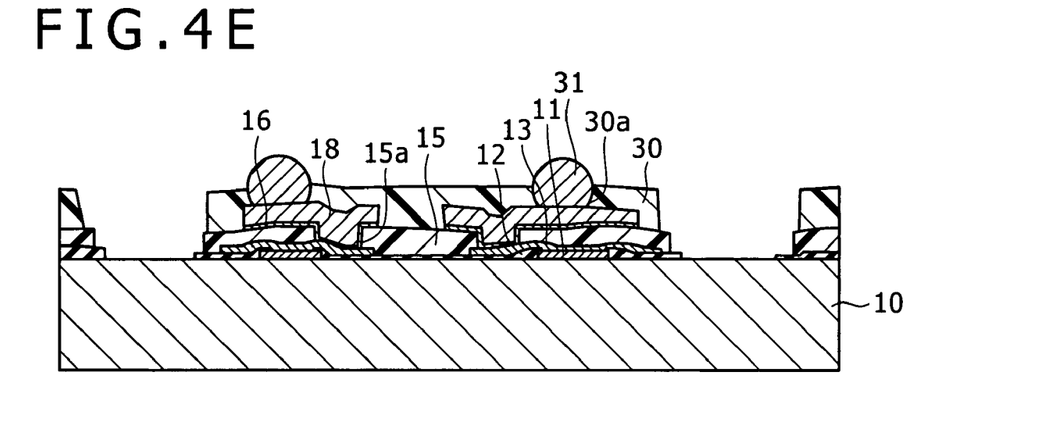

Then, as shown in FIG. 4E, bumps (protrusive electrodes) 31 are formed in the openings 30a in the second insulating layer 30 by placing solder balls or printing solder paste.

Figure 4F:
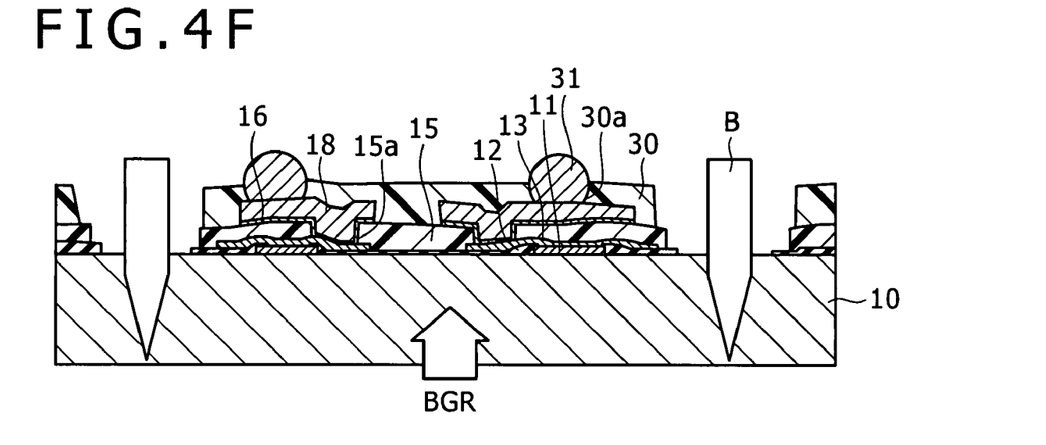

Thereafter, as shown in FIG. 4F, the silicon substrate 10 is thinned to a desired thickness from its reverse side by BGR, for example, and is diced into individual semiconductor devices by blades B.

The semiconductor device shown in FIG. 3 is now completed.

The method of manufacturing the semiconductor device according to the second embodiment offers the following advantages: When the first interconnections 13 and the second interconnections (16, 18) are formed on the silicone substrate 10, the first interconnections 13 are directly formed as a very thin film having a thickness equal to or less than 1 μm, with no resin insulating layer required beneath the first interconnections 13.

Therefore, when a packaged semiconductor device with rerouting interconnections disposed on a semiconductor substrate is manufactured by the above method, an insulating layer in which the rerouting interconnections embedded therein is made thin.

The present invention is not limited to the details described above, but the illustrated embodiments may be modified.

For example, passive components such as inductors and capacitors may be formed in the first and second interconnections.

Semiconductor chips may be embedded in the insulating layers.

In the illustrated embodiment, the interconnections in the two layers, i.e., the first and second interconnections, are provided in the insulating layers. However, the interconnections may be provided in more or less layers. Similarly, the semiconductor device may have more or less insulating layers than described above.

Although certain preferred embodiments of the present invention have been shown and described in detail, it should be understood that various changes and modifications may be made therein without departing from the scope of the appended claims.

It should be understood by those skilled in the art that various modifications, combinations, sub-combinations and alterations may occur depending on design requirements and other factor in so far as they are within the scope of the appended claims or the equivalents thereof.

What is claimed is:

1. A semiconductor device in a packaged form including a semiconductor, comprising:
 a semiconductor substrate with an active component and pads disposed having a top surface above a surface of the semiconductor substrate and connected to the active component;
 a plurality of first interconnection conductors disposed over said semiconductor substrate and individually contacting the top surface of corresponding said pads, wherein there is only a single thin protective layer between portions of the first interconnection conductors and the top surface of the semiconductor substrate adjacent to the pads;
 a first insulating layer disposed over said semiconductor substrate in covering relation to said first interconnection conductors and having openings each reaching a corresponding portion of said first interconnection conductors; and
 a plurality of second interconnection members disposed in said opening and on said first insulating layer and connected to said first interconnection, and further wherein the first interconnection conductors extend horizontally away from the pads and the second interconnection extends horizontally away from a corresponding opening in the first insulating layer.

2. The semiconductor device according to claim 1, wherein said first interconnection has a film thickness equal to or less than 1 μm.

3. The semiconductor device according to claim 1, wherein each said first interconnection has an interconnection region and a land region/wider than said interconnection region, said opening reaching said land region.

4. The semiconductor device according to claim 1, further comprising:

a buffer layer disposed on an insulating layer including said first insulating layer;

an electrically conductive post extending through said buffer layer and connected to an interconnection layer including said first interconnection and second interconnection; and a protrusive electrode disposed on an upper surface of said electrically conductive post and projecting from a surface of said buffer layer.

\* \* \* \* \*